US010680603B2

(12) United States Patent
Devaney et al.

(10) Patent No.: US 10,680,603 B2
(45) Date of Patent: Jun. 9, 2020

(54) ISOLATION AND VOLTAGE REGULATION CIRCUIT

(71) Applicant: Intelligent Energy Limited, Loughborough (GB)

(72) Inventors: Brendan Devaney, Loughborough (GB); Stephen Lawes, Loughborough (GB)

(73) Assignee: Intelligent Energy Limited, Loughborough (GB)

( * ) Notice: Subject to any disclaimer, the term of this patent is extended or adjusted under 35 U.S.C. 154(b) by 38 days.

(21) Appl. No.: 15/773,462

(22) PCT Filed: Oct. 25, 2016

(86) PCT No.: PCT/GB2016/053318
§ 371 (c)(1),
(2) Date: May 3, 2018

(87) PCT Pub. No.: WO2017/077270
PCT Pub. Date: May 11, 2017

(65) Prior Publication Data
US 2018/0323781 A1    Nov. 8, 2018

(30) Foreign Application Priority Data

Nov. 3, 2016 (GB) .................................. 1519433.5

(51) Int. Cl.
*H03K 17/30* (2006.01)
*H01M 8/043* (2016.01)
(Continued)

(52) U.S. Cl.
CPC ............ *H03K 17/30* (2013.01); *H01M 8/043* (2016.02); *H01M 8/0488* (2013.01);
(Continued)

(58) Field of Classification Search
CPC ................. H03K 17/30; H03K 17/302; H03K 2017/307; H01M 8/043; H01M 8/04298;
(Continued)

(56) References Cited

U.S. PATENT DOCUMENTS

2016/0054746 A1* 2/2016 Thakur ................... G05F 1/468
327/540
2016/0232962 A1* 8/2016 Mozak ................... G11C 5/147

FOREIGN PATENT DOCUMENTS

FR          2865069 A1     7/2005
JP          H06-083466 A   3/1994

OTHER PUBLICATIONS

International Patent Application No. PCT/GB2016/053318; Int'l Written Opinion and the Search Report; dated Feb. 1, 2017; 9 pages.
(Continued)

*Primary Examiner* — Adolf D Berhane
(74) *Attorney, Agent, or Firm* — Baker Hostetler, LLP

(57) ABSTRACT

The disclosure relates to an isolation and voltage regulation circuit for an electrochemical power source, the circuit comprising: an input terminal (202) for coupling to the power source and receiving an input voltage (Vin) from the power source; an output terminal (204) for coupling to a load; a diode circuit (206) connected between the input terminal and the output terminal; a diode controller (208) configured to control electrical conduction through the diode circuit between the input terminal and the output terminal, the diode controller having a first controller input (210) coupled to the output terminal and a second controller input (212); and a reference controller (220) configured to set a voltage at the second controller input (212) in accordance with a comparison between the input voltage (Vin) and a reference voltage (Vref).

16 Claims, 2 Drawing Sheets

Figure 1:
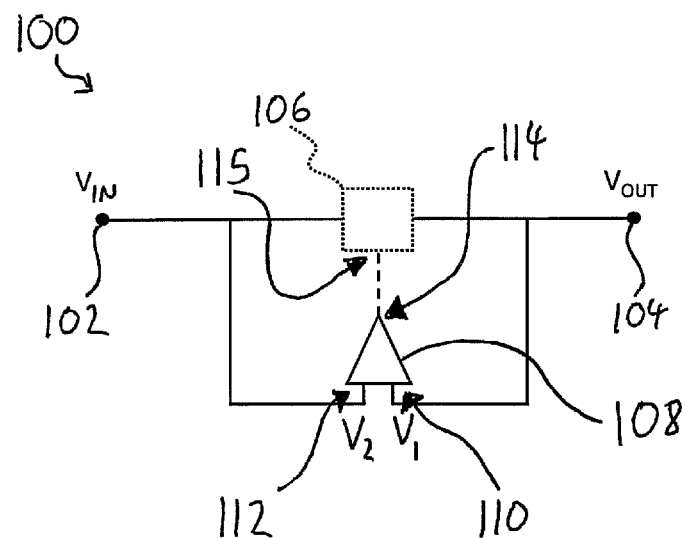

(51) Int. Cl.
    *H02J 1/10*         (2006.01)
    *H01M 8/04858*   (2016.01)

(52) U.S. Cl.
    CPC ......... *H01M 8/04953* (2016.02); *H02J 1/108* (2013.01); *H03K 17/302* (2013.01); *H02J 1/106* (2020.01); *H03K 2017/307* (2013.01)

(58) Field of Classification Search
    CPC ........... H01M 8/0488; H01M 8/04858; H01M 8/04865
    See application file for complete search history.

(56) References Cited

OTHER PUBLICATIONS

International Patent Application No. PCT/GB2016/053318; Int'l Preliminary Report on Patentability; dated May 8, 2018; 6 pages.

\* cited by examiner

ISOLATION AND VOLTAGE REGULATION CIRCUIT

The present disclosure relates to an isolation and voltage regulation circuit for an electrochemical power source, and in particular although not exclusively to an isolation voltage regulation circuit for use with a fuel cell or fuel cell stack as a power source.

Some electrochemical power sources, such as hydrogen fuel cells, typically present a high open circuit voltage (OCV) when no current is drawn by a load. Isolation of a fuel cell stack may be required from time-to-time in order to enable servicing, or in order to reduce fuel consumption or increase the life of the stack when power is not required.

The OCV may be as high as 1.1 V per cell in a typical hydrogen fuel cell, which equates to 79.2 V for an example fuel cell stack with 72 cells. However, the available voltage in a fuel cell system quickly drops once a load is applied and current is drawn. The total load of a fuel cell system typically has several components including a DC/DC converter, fuel cell controllers and an application load. A difficulty encountered in some applications is that the initial OCV supplied by the power source may be higher than can be tolerated by the DC/DC converter, which could cause damage to the converter or result in a malfunction.

In order to avoid the risk of damaging the DC/DC converter, the converter may be selected to have a specification that is capable of handling the OCV in addition to a normal operating voltage. However, in order to accommodate this requirement, more stringent demands are made of the converter and so the complexity and cost of the converter may be increased. As such, it may not be appropriate or desirable to provide a higher capability converter in all applications.

One method for accommodating a high initial OCV and ensuring that the initial OCV does not damage the converter is to apply a sufficient load in order to pull down the power source voltage to an acceptable voltage level during all modes of operation, that is, during start-up and during steady-state operation. However, a disadvantage of such a method is that it reduces the power efficiency of the system if an additional load is required to draw current from the power source during steady-state operation.

According to a first aspect of the invention there is provided an isolation and voltage regulation circuit for an electrochemical power source, the circuit comprising:
an input terminal for coupling to the power source and for receiving an input voltage from the power source;
an output terminal for coupling to a load;
a diode circuit connected between the input terminal and the output terminal;
a diode controller configured to control electrical conduction through the diode circuit between the input terminal and the output terminal, the diode controller having a first controller input coupled to the output terminal and a second controller input; and
a reference controller configured to set a voltage at the second controller input in accordance with a comparison between the input voltage and a reference voltage.

The reference controller may be coupled between the input terminal and the second controller input. The reference controller may be configured to set the voltage at the second controller input by switchably coupling the second controller input to a reference voltage source when the input voltage is greater than the reference voltage. The reference controller may be configured to set the voltage at the second controller input by switchably coupling the second controller input to the input terminal when the input voltage is less than the reference voltage. The reference controller may be configured to couple the second controller input to the input terminal when the input voltage is equal to the reference voltage. The reference controller may comprise selection circuitry. The selection circuitry may be configured to select whether the input voltage or the reference voltage is provided as a second voltage to the second controller input of the diode controller. The reference controller may comprises a reference comparator with a first reference input, a second reference input and a reference output. The first reference input may be connected to the input terminal in order to receive the input voltage. The second reference input may be connected to the reference voltage source in order to receive the reference voltage. A signal from the reference output may be provided to control the selection circuitry.

The diode controller may have a first controller input, a second controller input and a controller output. The diode controller may be configured to drive the controller output to maintain a voltage equal to the reference voltage. The diode controller may be configured to drive the controller output to maintain a constant voltage difference between the first and second controller inputs.

The diode circuit may comprise a switchable element. The switchable element may be a field effect transistor. The diode circuit may comprise a pair of switchable elements connected between the input terminal and the output terminal. The control circuit may be coupled to the pair of switchable elements.

According to a further aspect of the invention there is provided a system comprising the isolation and voltage regulation circuit and an electrochemical power source connected to the input terminal of the diode controller or isolation and voltage regulation circuit. The reference voltage may be higher than a nominal operating voltage of the electrochemical power source. The reference voltage may be lower than a maximum operating voltage of the load. The electrochemical power source may comprise a fuel cell.

According to a further aspect of the invention there is provided a method of operating an isolation and voltage regulation circuit for an electrochemical power source, the circuit comprising:
an input terminal coupled to the power source and receiving an input voltage from the power source;
an output terminal coupled to a load;
a diode circuit connected between the input terminal and the output terminal;
a diode controller controlling electrical conduction through the diode circuit between the input terminal and the output terminal, the diode controller having a first controller input coupled to the output terminal and a second controller input; and
a reference source providing a reference voltage,
the method comprising:
comparing the input voltage and the reference voltage
setting a voltage at the second controller input in accordance with a result of the comparison.

The method may comprise setting the voltage at the second controller input as the reference voltage when the input voltage is greater than the reference voltage. The method may comprise setting the voltage at the second controller input as the input voltage when the input voltage is less than the reference voltage.

Figure 2:
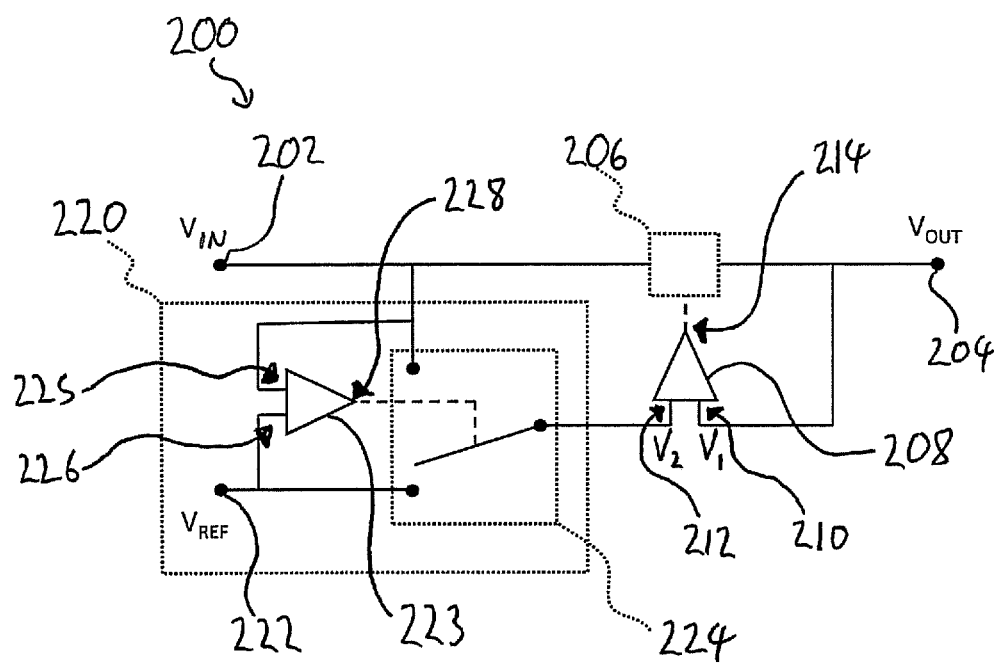
Figure 3:
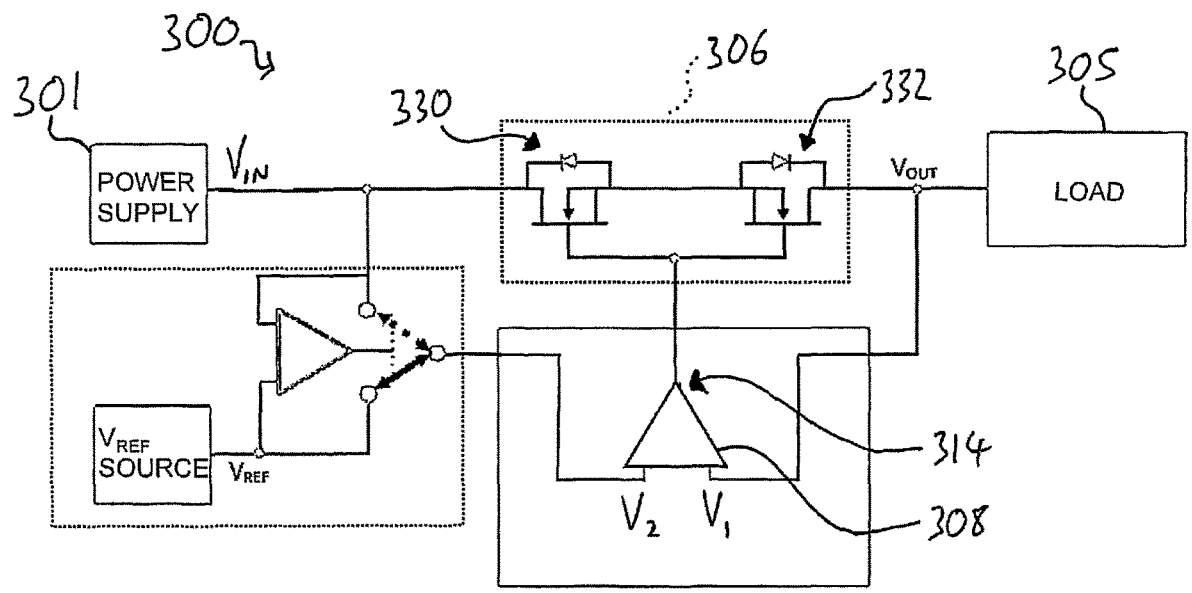
Figure 4:
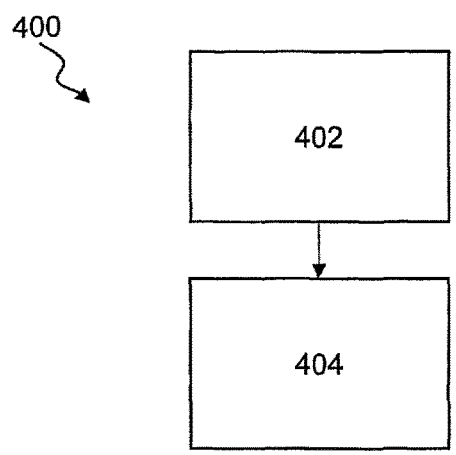

Embodiments of the present invention will now be described by way of example and with reference to the accompanying drawings in which:

FIG. 1 illustrates an ideal diode for coupling a power source to a load;

FIG. 2 illustrates an isolation and voltage regulation circuit for a power supply in which the load is protected from excess open circuit voltage from the power supply; and FIG. 3 illustrates a system comprising a fuel source, a load and an isolation and voltage regulation circuit with a dual transistor arrangement providing a diode circuit; and FIG. 4 illustrates a method of operating an isolation and voltage regulation circuit.

Some power sources, such as a fuel cell stack, may require electrical isolation when not in use in order to maintain the satisfactory performance of the stack over its lifetime. Further, such a power source may be damaged when a reverse polarity is applied to it. In order to provide selective electrical isolation and to avoid the application of back-EMF to the power source, an ideal diode circuit may be provided. An ideal diode ensures that current flows only in a forward direction so that power is only supplied by the power source rather than to the power source and isolates the power source when no current flow is present.

FIG. 1 illustrates an ideal diode 100 for coupling a power source to a load. The ideal diode 100 comprises an input terminal 102 for coupling to the power source to receive an input voltage $V_{IN}$, an output terminal 104 for coupling to a load and providing an output voltage $V_{OUT}$, an ideal diode circuit 106 and an ideal diode controller 108. The ideal diode circuit 106 and ideal diode controller 108 together provide a practical implementation that approximates the functionality of an ideal diode.

An ideal diode has two modes of operation: (i) a conductive mode which provides no resistance to voltage flow in the forward direction between the input terminal 102 and the output terminal 104 and (ii) a non-conductive mode which provides infinite resistance to voltage flow in the reverse direction between the output terminal 104 and the input terminal 102. In this way, the power supply can be protected from back-EMF. In practice, deviation from the ideal behaviour is observed. However, an implementation of an ideal diode will typically provide better forward conduction efficiency than a conventional diode.

In this example, the ideal diode circuit 106 is connected between the input terminal 102 and the output terminal 104 and is configured to control current flow between the input terminal 102 and the output terminal 104.

The ideal diode controller 108 has a first controller input 110 coupled to the output terminal 104, a second controller input 112 coupled to the input terminal 102, a control output 114 operatively coupled to a controller input 115 of the ideal diode circuit 106. The ideal diode controller 108 may be provided by a differential amplifier. The ideal diode controller 108 is configured to compare a voltage at the input terminal 102 and a voltage at the output terminal 104 and enable or disable current flow through the ideal diode circuit in accordance with the comparison.

The ideal diode circuit 106 may be considered to provide a controllable switch with an open state and a closed state. In order to provide the functionality of an ideal diode, the ideal diode controller 108 should:

close the controllable switch of the ideal diode circuit 106 and so enable current flow through the ideal diode circuit 106 in a conductive mode if a first voltage $V_1$ at the first controller input 110 is less than a second voltage $V_2$ at the second controller input 112.

open the controllable switch and so disable current flow through the ideal diode circuit 106 in a reverse bias mode if the first voltage $V_1$ at the first controller input 110 is greater than a second voltage $V_2$ at the second controller input 112.

In practice, the ideal diode controller 108 may approximate this functionality by providing the control output 114 in order to maintain a constant voltage difference $V_2-V_1$ between the first and second controller inputs 110, 112, the constant voltage difference being equal to the voltage drop resulting from an on resistance of the ideal diode circuit.

The ideal diode circuit 106 may comprise a controllable switch, such as a field effect transistor or a pair of field effect transistors with common source and gate connections. The ideal diode controller 108 is configured to drive the ideal diode circuit 106 to fully turn on the field effect transistors during conductive mode operation. In the conductive mode a constant voltage is dropped across the ideal diode circuit 106. The dropped voltage relates to the on resistance of the ideal diode circuit 106. For a pair of field effect transistors with their conduction path connected in series the on resistance may be approximately 30 mV. For example, if the input voltage $V_{IN}$ is 72 V, the output voltage $V_{OUT}$ will be controlled to 71.97 V when the switch is closed. The power $P_{FET}$ dissipated by the ideal diode circuit 106 is the product of the current flow through the ideal diode circuit 106 (which is of course the same as the current $I_{LOAD}$ drawn by the load) and the voltage drop across the ideal diode circuit 106. That is:

$$P_{FET}=I_{LOAD}*(V_{STACK}-V_{OUT})$$

In some examples, the power source may be required to supply between 40 A and 60 A through the ideal diode circuit 106. In such a case, the power that must be dissipated by the ideal diode circuit 106 is between 1.2 W and 1.8 W.

FIG. 2 illustrates an isolation and voltage regulation circuit 200 for a power source, such as an electrochemical power source. In this example, the regulation circuit 200 has been adapted over the ideal diode described previously with reference to FIG. 1 in order to prevent the supply of excess voltage to a load when the load is first connected to the power source. This objective is achieved by setting a voltage at the second controller input in accordance with a comparison between the input voltage and a reference voltage, as described below.

The regulation circuit 200 comprises the components of the voltage regulator described with reference to FIG. 1. Corresponding reference numerals are used between the figures to refer to similar components. The regulation circuit 200 differs from the ideal diode described with reference to FIG. 1 in that it further comprises a reference controller 220. The reference controller 220 is coupled between the input terminal 202 and the second controller input 212. A reference voltage $V_{REF}$ is provided to the reference controller 220 by a reference voltage source 222. If the input impedances of the second controller input 212 of the diode controller 208 and the input of the reference controller 220 are high or effectively infinite then the reference voltage source may only require a very low current and so not substantially reduce the efficiency of the circuit 200. The reference voltage $V_{REF}$ provided by the reference voltage source 222 may be obtained from the input voltage $V_{IN}$ at the input terminal 202. In this example the reference controller comprises a reference comparator 220 and selection circuitry 224.

The selection circuitry 224 is exemplified by a controllable single-pole double-throw switch, which may be provided by a suitable transistor arrangement using one or more field effect transistors, for example.

The reference comparator 223 has a first reference input 225, a second reference input 226 and a reference output 228. The first reference input 225 is connected to the input terminal 202 in order to receive the input voltage $V_{IN}$. The second reference input 226 is connected to the reference voltage source 222 in order to receive the reference voltage $V_{REF}$. A signal from the reference output 228 is provided to control the selection circuitry 224 in order to select whether the input voltage $V_{IN}$ or the reference voltage $V_{REF}$ is provided as a second voltage $V_2$ to the second controller input 212 of the diode controller 208. In this way, the reference controller 220 is configured to switchably couple the second controller input 212 to the reference voltage source 222 if the input voltage $V_{IN}$ at the input terminal 202 is greater than the reference voltage $V_{REF}$ and to the input terminal 202 if the input voltage $V_{IN}$ is less than the reference voltage $V_{REF}$. The reference controller 220 may also be configured to couple the second controller input 212 to the input terminal 202 in response to the input voltage $V_{IN}$ being equal to the reference voltage $V_{REF}$.

During operation, the control output 214 of the diode controller 208 is configured to drive the diode circuit 206 to maintain a constant voltage difference $V_2-V_1$ between its first and second controller inputs 210, 212 in forward current conditions, similar to the operation of the corresponding component in the conductive mode of the ideal diode circuit described previously with reference to FIG. 1. However, in the example of FIG. 2, the second controller input 212 may receive the input voltage $V_{IN}$, or if the stack voltage is too high, receive the reference voltage $V_{REF}$ as the second voltage $V_2$. In this respect, the diode controller 208 has a first conductive mode (in which the output voltage $V_{OUT}$ is based on the reference voltage $V_{REF}$) and a second conductive mode (in which the output voltage $V_{OUT}$ is based on the input voltage $V_{IN}$) in contrast to the single conductive mode provided by the ideal diode of FIG. 1. Because the diode controller 208 is configured to drive its output to maintain a constant difference between its first and second controller inputs 210, 212, the voltage at the output terminal 204 will not exceed the reference voltage $V_{REF}$ in either the first or the second conductive mode. In reverse-biased conditions, the diode controller 208 will behave in a similar way as in the non-conductive mode of operation of the ideal diode described with reference to FIG. 1 and so reverse current flow through the diode circuit 206 is prevented.

The selection of the reference voltage $V_{REF}$ may be determined by the highest acceptable voltage for the intended load circuitry and consideration of the power handling capabilities of any switchable elements, for example FETs, used in the diode circuit 206. The reference voltage $V_{REF}$ may be selected to be as high as possible (and higher than the input voltage $V_{IN}$ provided by the power source at nominal loading) in order to minimise power dissipation across the FETs during an OCV event. The larger the required voltage drop across the FETs, the larger the power dissipation.

In an example in which the diode controller 208 drives the diode circuit 206 to maintain the constant voltage difference $V_2-V_1$ of approximately 30 mV in the first and second conductive modes, and in which the input voltage $V_{IN}$ is initially an open circuit voltage (OCV) of 72 V and the reference voltage $V_{REF}$ is 60 V then the diode controller 208 will drive the output voltage $V_{OUT}$ to 59.97 V ($V_{REF}$–30 mV) in the first conductive mode. In this case, a voltage of 12.03 V is dropped across the diode circuit ($V_{IN}$–($V_{REF}$–30 mV)). In some examples, although the power source may be required to supply between 40 A and 60 A in order to power the load at the output terminal 204, it has been found that a fuel cell power source may only be able to supply a current of about 1 A during OCV conditions. Therefore, when the diode controller 208 is operating in the first conductive mode a current of around 1 A flows through the diode circuit 206, rather than the higher current that would typically be drawn during normal operation. In such a case, the power that must be dissipated by the diode circuit 206 in the first conductive mode is between about 12 W. This power level may be handled for a short duration by a wide range of low to medium cost components that are suitable for implementing the diode circuit 206.

Subsequent to connection of the fuel cell power supply to the load, the input voltage $V_{IN}$ is pulled down from the open circuit voltage (OCV) to a normal operating voltage because the power source is unable to maintain the OCV at the required current. Once the input voltage $V_{IN}$ has fallen below the reference voltage $V_{REF}$, the reference controller 220 provides the input voltage $V_{IN}$ as the second voltage $V_2$ to the second controller input 212 and so the diode controller 208 operates in the second conductive mode. In the second conductive mode, the voltage dropped across the diode circuit 206 is similar to that of the conductive mode of the ideal diode described previously with reference to FIG. 1 and so the power dissipated by the diode circuit 206 is about 1.2 W.

In the non-conductive mode, which may also be referred to as a reverse bias mode, substantially no current flows through the diode circuit 206 and no power is dissipated, which is the same for the non-conductive mode of the ideal diode described previously.

The diode controller 206 may be provided by one or more field effect transistors, each transistor having a conduction channel connected between the input terminal 202 and the output terminal 204. The provision of a plurality of transistors within the diode controller 206 enables power dissipation over a larger active area and so reduces heat concentration. During the first conductive mode, the diode controller 208 may be configured to drive the one or more transistors within a linear operating region in which the voltage applied to the gate is proportional to the current flow enabled through the conduction channel.

FIG. 3 illustrates a system 300 comprising a power supply 301, a load 305 and an isolation and voltage regulation circuit that is similar to the circuit described previously with reference to FIG. 2. In this example, the diode circuit 306 is provided by a pair of n-channel field effect transistors including first and second transistors 330, 332. The controller output 314 of the diode controller circuit 308 is connected to a gate of the first transistor 330 and a gate of the second transistor 332. A source of the first transistor 330 is connected to a source of the second transistor 332. A drain of the first transistor 330 is connected to the input terminal 302. A drain of the second transistor 332 is connected to the output terminal 304.

The load 305 has several components (not shown) including a DC/DC converter, fuel cell support circuitry, such as controllers that may be considered to provide a parasitic load, and an application load, which may also be described as an external load. The DC/DC converter may be coupled between the regulation circuit and the other components of the load. The use of the regulation circuit enables the DC/DC converter to be provided to a lower specification and therefore lower complexity and cost.

The embodiments described above with reference to FIGS. 2 and 3 may be particularly suitable for use with electrochemical fuel cells, but may also be adapted for use with other electrochemical power sources, such as batteries.

FIG. 4 illustrates a method 400 of operating an isolation and voltage regulation circuit such as the circuit described previously with reference to FIG. 3 or FIG. 4. The method 400 comprises comparing 402 the input voltage and the reference voltage and setting 404 a voltage at the second controller input in accordance with a result of the comparison. The method may include the step of setting the voltage at the second controller input as the reference voltage if the input voltage is greater than the reference voltage. The method may also include the step of setting the voltage at the second controller input as the input voltage when the input voltage is less than the reference voltage. The method may further include any steps described previously with reference to the circuits illustrated in FIGS. 2 and 3.

Other embodiments are intentionally within the scope of the accompanying claims.

The invention claimed is:

1. An isolation and voltage regulation circuit for an electrochemical power source, the circuit comprising:
   an input terminal for coupling to the power source and for receiving an input voltage from the power source;
   an output terminal for coupling to a load;
   a diode circuit connected between the input terminal and the output terminal;
   a diode controller configured to cause a plurality of different electrical conduction modes through the diode circuit between the input terminal and the output terminal, the diode controller having a first controller input coupled to the output terminal and a second controller input; and
   a reference controller configured to set a voltage at the second controller input in accordance with a comparison between the input voltage and a reference voltage,
   wherein an output voltage at the output terminal does not exceed the reference voltage in any of the electrical conduction modes.

2. The circuit of claim 1 in which the reference controller is coupled between the input terminal and the second controller input.

3. The circuit of claim 2 in which the reference controller is configured to set the voltage at the second controller input by switchably coupling the second controller input to (i) a reference voltage source when the input voltage is greater than the reference voltage and (ii) the input terminal when the input voltage is less than the reference voltage.

4. The circuit of claim 3 in which the reference controller is configured to couple the second controller input to the input terminal when the input voltage is equal to the reference voltage.

5. The circuit of claim 3 in which the reference controller comprises selection circuitry configured to select whether the input voltage or the reference voltage is provided as a second voltage to the second controller input of the diode controller.

6. The circuit of claim 5 in which the reference controller comprises a reference comparator with a first reference input, a second reference input and a reference output, the first reference input is connected to the input terminal in order to receive the input voltage, the second reference input is connected to the reference voltage source in order to receive the reference voltage, and a signal from the reference output is provided to control the selection circuitry.

7. The circuit of claim 1 in which the diode controller has a first controller input, a second controller input and a controller output and is configured to drive the controller output to maintain a voltage equal to the reference voltage.

8. The circuit of claim 1 in which the diode circuit comprises a switchable element.

9. The circuit of claim 8 in which the switchable element is a field effect transistor.

10. The circuit of any claim 8 in which the diode circuit comprises a pair of switchable elements connected between the input terminal and the output terminal, and in which the diode controller is coupled to the pair of switchable elements.

11. A system comprising the isolation and voltage regulation circuit of claim 1 and an electrochemical power source connected to the input terminal of the isolation and voltage regulation circuit.

12. The system of claim 11 in which the electrochemical power source comprises a hydrogen fuel cell.

13. The circuit of claim 1,
   wherein the first controller input is directly coupled to the output terminal, and
   wherein the input terminal is directly coupled to a reference comparator that performs the comparison.

14. The circuit of claim 1 in which the diode controller is further configured to cause another, different mode, the other mode being electrically non-conductive.

15. A method of operating an isolation and voltage regulation circuit for an electrochemical power source, the circuit comprising:
   an input terminal coupled to the power source and receiving an input voltage from the power source;
   an output terminal coupled to a load;
   a diode circuit connected between the input terminal and the output terminal;
   a diode controller causing a plurality of different electrical conduction modes through the diode circuit between the input terminal and the output terminal, the diode controller having a first controller input coupled to the output terminal and a second controller input; and
   a reference source providing a reference voltage,
   the method comprising:
   comparing the input voltage and the reference voltage and setting a voltage at the second controller input in accordance with a result of the comparison,
   wherein an output voltage at the output terminal does not exceed the reference voltage in any of the electrical conduction modes.

16. The method of claim 15 comprising setting the voltage at the second controller input as:
   the reference voltage when the input voltage is greater than the reference voltage; and
   the input voltage when the input voltage is less than the reference voltage.

* * * * *